(12) United States Patent
Okita et al.

(10) Patent No.: US 9,324,814 B2
(45) Date of Patent: *Apr. 26, 2016

(54) SILICON CARBIDE SINGLE-CRYSTAL SUBSTRATE

(71) Applicant: Sumitomo Electric Industries, Ltd., Osaka-shi, Osaka (JP)

(72) Inventors: Kyoko Okita, Itami (JP); Keiji Ishibashi, Itami (JP)

(73) Assignee: SUMITOMO ELECTRIC INDUSTRIES, LTD., Osaka-shi, Osaka (JP)

(*) Notice: Subject to any disclaimer, the term of this patent is extended or adjusted under 35 U.S.C. 154(b) by 0 days.

This patent is subject to a terminal disclaimer.

(21) Appl. No.: 14/618,432

(22) Filed: Feb. 10, 2015

(65) Prior Publication Data

US 2015/0162409 A1    Jun. 11, 2015

Related U.S. Application Data

(63) Continuation of application No. 13/782,222, filed on Mar. 1, 2013, now Pat. No. 8,975,643.

(60) Provisional application No. 61/622,082, filed on Apr. 10, 2012.

(30) Foreign Application Priority Data

Apr. 10, 2012 (JP) ................. 2012-088916

(51) Int. Cl.
  *H01L 29/16*     (2006.01)
  *H01L 29/34*     (2006.01)
  (Continued)

(52) U.S. Cl.
  CPC ............... *H01L 29/34* (2013.01); *B24B 9/065*
(2013.01); *B24D 3/06* (2013.01); *H01L 23/562*
(2013.01); *H01L 29/04* (2013.01); *H01L
29/1608* (2013.01); *H01L 2924/0002* (2013.01)

(58) Field of Classification Search
  CPC ....... H01L 29/34; H01L 29/04; H01L 23/562; H01L 29/1608; H01L 2924/0002; B24D 3/06; B24B 9/065
  See application file for complete search history.

(56) References Cited

U.S. PATENT DOCUMENTS

| 4,663,890 | A  | 5/1987  | Brandt |
| 7,638,439 | B2 | 12/2009 | Kubota et al. |

(Continued)

FOREIGN PATENT DOCUMENTS

| JP | 9-168947 A    | 6/1997 |
| JP | 2006-120865 A | 5/2006 |

(Continued)

OTHER PUBLICATIONS

U.S. Office Action dated Aug. 31, 2015, issued in U.S. Appl. No. 14/619,510.

*Primary Examiner* — Howard Weiss
*Assistant Examiner* — Sue Tang
(74) *Attorney, Agent, or Firm* — Drinker Biddle & Reath LLP

(57) ABSTRACT

A silicon carbide single-crystal substrate includes a first surface, a second surface opposite to the first surface, and a peripheral edge portion sandwiched between the first surface and the second surface. A plurality of grinding traces are formed in a surface of the peripheral edge portion. A chamfer width as a distance from an outermost peripheral end portion of the peripheral edge portion to one of the plurality of grinding traces which is located on an innermost peripheral side of the peripheral edge portion in a direction parallel to the first surface is not less than 50 µm and not more than 400 µm. Thereby, a silicon carbide single-crystal substrate capable of suppressing occurrence of a crack, and a method for manufacturing the same can be provided.

9 Claims, 3 Drawing Sheets

(51) Int. Cl.
*B24B 9/06* (2006.01)
*B24D 3/06* (2006.01)
*H01L 23/00* (2006.01)
*H01L 29/04* (2006.01)

(56) References Cited

U.S. PATENT DOCUMENTS

| | | | | |
|---|---|---|---|---|
| 8,975,643 | B2 * | 3/2015 | Okita | H01L 29/1608 257/77 |
| 2007/0264822 | A1 | 11/2007 | Kubota et al. | |
| 2007/0264911 | A1 * | 11/2007 | Mattes | H01L 21/02021 451/41 |
| 2009/0186470 | A1 | 7/2009 | Takahashi et al. | |
| 2011/0068434 | A1 * | 3/2011 | Yamaguchi | C30B 29/406 257/615 |

FOREIGN PATENT DOCUMENTS

| | | | |
|---|---|---|---|
| JP | 2008-177287 | A | 7/2008 |
| JP | 2008177287 | A * | 7/2008 |
| JP | 2009-231833 | A | 10/2009 |
| JP | 2011-071180 | A | 4/2011 |
| JP | 2011-219297 | A | 11/2011 |

* cited by examiner

SILICON CARBIDE SINGLE-CRYSTAL SUBSTRATE

CROSS-REFERENCE TO RELATED APPLICATIONS

This application is a continuation application of U.S. application Ser. No. 13/782,222, filed Mar. 1, 2013, which claims the benefit of U.S. Provisional Application No. 61/622,082 filed Apr. 10, 2012, the contents of each of which are incorporated herein by reference. U.S. Provisional Application No. 61/622,082 claims the benefit of Japanese Patent Application No. 2012-088916, filed Apr. 10, 2012.

BACKGROUND OF THE INVENTION

1. Field of the Invention

The present invention relates to a silicon carbide single-crystal substrate and a method for manufacturing the silicon carbide single-crystal substrate, and more particularly to a silicon carbide single-crystal substrate having a peripheral edge portion and a method for manufacturing the silicon carbide single-crystal substrate.

2. Description of the Background Art

A semiconductor substrate is manufactured, for example, by cutting a cylindrical ingot with a wire saw, and grinding and polishing a surface and a peripheral edge portion of a cut substrate. Processing of the peripheral-edge portion of the semiconductor substrate is called beveling processing or chamfering processing.

A method for processing a peripheral edge portion of a silicon wafer is described for example in Japanese Patent Laying-Open No. 9-168947. According to the method, a peripheral edge portion of a silicon wafer is ground by pressing a diamond grindstone against the peripheral edge portion of the silicon wafer and simultaneously applying ultrasonic vibration to the diamond grindstone.

Further, a method for polishing a peripheral edge portion of a nitride semiconductor substrate is described for example in Japanese Patent Laying-Open No. 2009-231833. According to the method, after a back surface of a nitride semiconductor wafer is flattened, a process-damaged layer produced at the back surface is removed by etching, and thereafter a peripheral edge portion of the wafer is ground with a diamond grindstone.

SUMMARY OF THE INVENTION

In recent years, silicon carbide single-crystal substrates have come into use to manufacture semiconductor devices, considering advantages such as high breakdown voltage, low ON resistance, and the like. Silicon carbide is harder than gallium nitride, and is difficult to be ground. There have been cases where, when a peripheral edge portion of a silicon carbide single-crystal substrate is processed by the method described in Japanese Patent Laying-Open No. 2009-231833 and thereafter an epitaxial layer is formed on the silicon carbide single-crystal substrate, a crack occurs in the epitaxial layer.

The present invention has been made to solve the aforementioned problem, and one object of the present invention is to provide a silicon carbide single-crystal substrate capable of suppressing occurrence of a crack, and a method for manufacturing the same.

A mechanism causing occurrence of a crack will now be described. When a silicon carbide single-crystal substrate is subjected to beveling processing, a process-damaged layer is formed in a chamfer portion of the substrate. The process-damaged layer refers to a layer having a disrupted crystal lattice. When a silicon carbide epitaxial layer is formed on the process-damaged layer, the epitaxial layer is grown abnormally because it is difficult to obtain lattice matching between the process-damaged layer and the epitaxial layer, and a crack extends in a direction of a main surface of the silicon carbide single-crystal substrate. If the crack grows, the silicon carbide single-crystal substrate may be broken. As a result of the earnest study of the relationship between the shape of the silicon carbide single-crystal substrate and occurrence of a crack, the inventors have found that the probability of occurrence of a crack is influenced by a chamfer width of the silicon carbide single-crystal substrate. If the silicon carbide single-crystal substrate has a small chamfer width, an abnormally-grown region of the epitaxial layer is close to the main surface of the silicon carbide single-crystal substrate, and thus a crack is likely to extend in the direction of the main surface. On the other hand, if the silicon carbide single-crystal substrate has a large chamfer width, there is a high probability that an edge portion may be chipped. If the edge portion is chipped, a crack occurs from the portion. Thus, occurrence of a crack can be suppressed by controlling the chamfer width within a certain range.

A silicon carbide single-crystal substrate in accordance with the present invention includes a first surface, a second surface opposite to the first surface, and a peripheral edge portion sandwiched between the first surface and the second surface. A plurality of grinding traces are formed in a surface of the peripheral edge portion. A chamfer width as a distance from an outermost peripheral end portion of the peripheral edge portion to one of the plurality of grinding traces which is located on an innermost peripheral side of the peripheral edge portion in a direction parallel to the first surface is not less than 50 μm and not more than 400 μm.

Here, being sandwiched between the first surface and the second surface includes being sandwiched between a surface parallel to the first surface and a surface parallel to the second surface.

The silicon carbide single-crystal substrate in accordance with the present invention has a chamfer width of not less than 50 μm and not more than 400 μm. Thereby, a silicon carbide single-crystal substrate capable of suppressing occurrence of a crack is obtained.

Preferably, in the silicon carbide single-crystal substrate, the surface of the peripheral edge portion has an arithmetic mean roughness of not less than 0.07 μm and not more than 3 μm. If the surface of the peripheral edge portion has a large arithmetic mean roughness, a crack is likely to occur because it is difficult to obtain lattice matching between an epitaxial layer and the peripheral edge portion. By setting the arithmetic mean roughness of the surface of the peripheral edge portion to not less than 0.07 μm and not more than 3 μm, a silicon carbide single-crystal substrate capable of suppressing occurrence of a crack is obtained.

Preferably, in the silicon carbide single-crystal substrate, the peripheral edge portion includes a process-damaged layer as a layer having a disrupted crystal lattice. The process-damaged layer has a maximum thickness of not less than 0.5 μm and not more than 10 μm. If the process-damaged layer is thick, a crack is likely to occur because it is difficult to obtain lattice matching between the process-damaged layer and the epitaxial layer. By setting the maximum thickness of the process-damaged layer to not less than 0.5 μm and not more than 10 μm, a silicon carbide single-crystal substrate capable of suppressing occurrence of a crack is obtained.

A method for manufacturing a silicon carbide single-crystal substrate in accordance with the present invention includes the steps of: preparing a silicon carbide single crystal having a pair of opposing main surfaces, and a peripheral edge portion sandwiched between the pair of main surfaces; preparing a grindstone having diamond abrasive grains embedded in a binder, a hardness grade of the diamond abrasive grains and the binder in accordance with the Japanese Industrial Standards being L to N, a degree of concentration of the diamond abrasive grains being not less than 80 and not more than 150; and polishing the peripheral edge portion using the grindstone. Thereby, a silicon carbide single-crystal substrate capable of suppressing occurrence of a crack is obtained.

Preferably, in the method for manufacturing a silicon carbide single-crystal substrate, the diamond abrasive grains have a grain size of #400 to #2500 in accordance with the Japanese Industrial Standards. Thereby, a silicon carbide single-crystal substrate capable of suppressing occurrence of a crack can be obtained more accurately.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
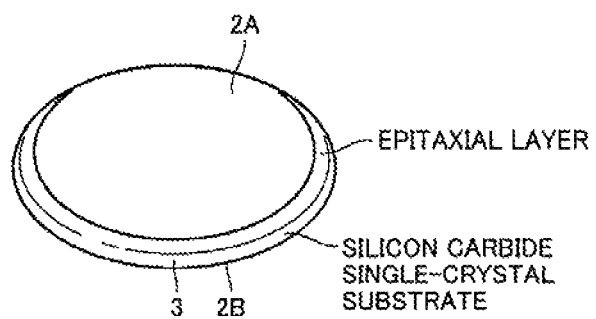
FIG. 1 is a perspective view schematically showing a configuration of a silicon carbide single-crystal substrate in accordance with one embodiment of the present invention.

The following describes an embodiment of the present invention with reference to the drawings. It is noted that in the below-mentioned drawings, the same or corresponding portions are given the same reference characters and are not described repeatedly.

Further, regarding crystallographic indications in the present specification, an individual orientation is represented by [ ], a group orientation is represented by < >, an individual plane is represented by ( ), and a group plane is represented by { }. In addition, a negative index is supposed to be crystallographically indicated by putting "-" (bar) above a numeral, but is indicated by putting the negative sign before the numeral in the present specification. For description of an angle, a system in which an omnidirectional angle is 360° is employed.

Figure 2:
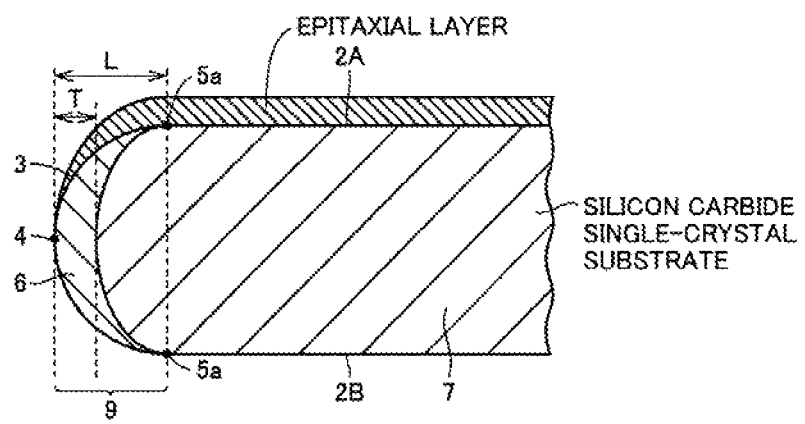
FIG. 2 is a cross sectional view schematically showing the configuration of the silicon carbide single-crystal substrate in accordance with one embodiment of the present invention.

A silicon carbide single-crystal substrate in accordance with the present embodiment will be described with reference to FIGS. 1 and 2.

A silicon carbide single-crystal substrate 1 in accordance with the present embodiment includes a first surface 2A (front surface), a second surface 2B (back surface, and a surface opposite to the first surface), and a peripheral edge portion 9 and a body portion 7 sandwiched between first surface 2A and second surface 2B. Peripheral edge portion 9 has a surface 3 of peripheral edge portion 9, and a process-damaged layer 6. Process-damaged layer 6 refers to a layer having a disrupted crystal lattice formed in a region of peripheral edge portion 9 close to surface 3 by grinding or polishing a crystal. The existence and thickness of process-damaged layer 9 can be confirmed by observing a cross section obtained by fracturing the crystal along a cleavage plane, through SEM (scanning electron microscope) observation, TEM (transmission electron microscope) observation, or cathodoluminescence observation.

Process-damaged layer 6 is formed from surface 3 of peripheral edge portion 9 toward body portion 7 of silicon carbide single-crystal substrate 1. A thickness T of process-damaged layer 6 is at its maximum at an outermost peripheral end portion 4 on surface 3 of peripheral edge portion 9, and becomes smaller toward first surface 2A and second surface 2B. Process-damaged layer 6 is formed in a circumferential direction of silicon carbide single-crystal substrate 1.

Figure 3:
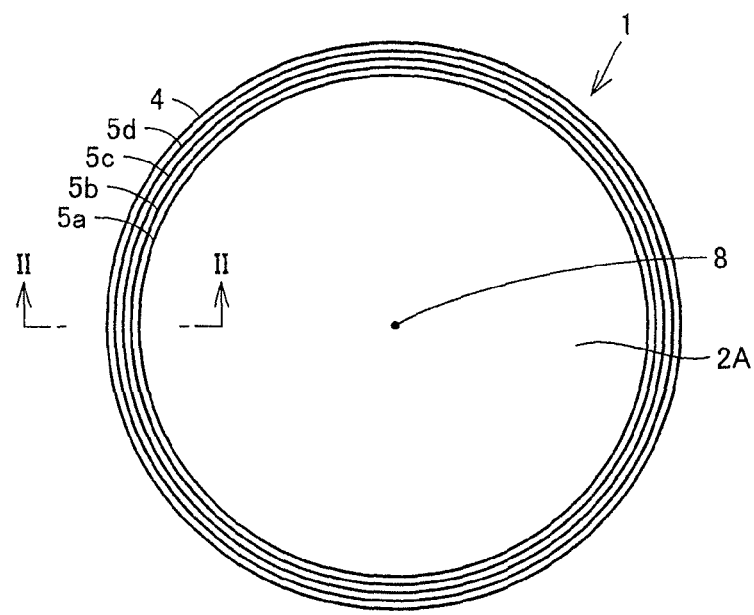
FIG. 3 is a plan view schematically showing the configuration of the silicon carbide single-crystal substrate in accordance with one embodiment of the present invention.

Referring to FIG. 3, in surface 3 of peripheral edge portion 9 of silicon carbide single-crystal substrate 1, a plurality of grinding traces 5a, 5b, 5c, and 5d are formed substantially concentrically. Grinding traces 5a, 5b, 5c, and 5d are formed for example by diamond abrasive grains in a grinding step described later. The existence of grinding traces 5a, 5b, 5c, and 5d can be confirmed with an optical microscope.

A region in which the grinding traces extending along the circumferential direction are formed in surface 3 of peripheral edge portion 9 of silicon carbide single-crystal substrate 1 is also referred to as a chamfer portion. In addition, a distance from outermost peripheral end portion 4 of peripheral edge portion 9 to grinding trace 5a located on an innermost peripheral side of peripheral edge portion 9 in silicon carbide single-crystal substrate 1, in a direction parallel to first surface 2A, is referred to as a chamfer width L. In the present embodiment, chamfer width L is not less than 50 μm and not more than 400 μm.

First surface 2A of silicon carbide single-crystal substrate 1 is mirror-polished. Both first surface 2A and second surface 2B may be mirror-polished. Generally, however, the chamfer portion is not mirror-polished. Thus, it can be said that the chamfer portion (in other words, peripheral edge portion 9) is a portion serving as a pearskin or a semi-mirror surface, and first surface 2A is a portion serving as a mirror surface.

Preferably, surface 3 of peripheral edge portion 9 of silicon carbide single-crystal substrate 1 has an arithmetic mean roughness ($R_a$) of not less than 0.07 μm and not more than 3 μm. Preferably, process-damaged layer 6 of peripheral edge portion 9 has a maximum thickness (T) of not less than 0.5 μm and not more than 10 μm. In addition, preferably, a value represented by $R_a \times T/L$ is not less than 0.0000875 and not more than 0.6, where $R_a$ represents the arithmetic mean roughness of surface 3 of peripheral edge portion 9 of silicon carbide single-crystal substrate 1, T represents the maximum thickness of process-damaged layer 6, and L represents the chamfer width.

Next, a method for manufacturing the silicon carbide single-crystal substrate in accordance with the present embodiment will be described.

First, a seed crystal made of single-crystal silicon carbide and source material powder made of silicon carbide are introduced into a crucible made of graphite. Next, by heating the source material powder, silicon carbide is sublimated and recrystallized on the seed crystal. On this occasion, recrystallization proceeds while a desired impurity such as nitrogen is being introduced. Then, when a crystal of a desired size is grown on the seed crystal, heating is stopped and a crystal of single-crystal silicon carbide is taken out from a container.

Next, the fabricated crystal of single-crystal silicon carbide is processed into an ingot having, for example, a cylindrical shape. The processed cylindrical ingot is set such that a portion of its side surface is supported by a support. Then, the ingot made of silicon carbide single crystal is cut with a wire saw in a running direction to intersect with a <0001> direction. Thereby, silicon carbide single-crystal substrate 1 having a desired plane orientation is cut out. It is noted that silicon carbide single-crystal substrate 1 has first surface 2A, second surface 2B opposite to the first surface, and peripheral edge portion 9 sandwiched between first surface 2A and second surface 2B.

Figure 7:
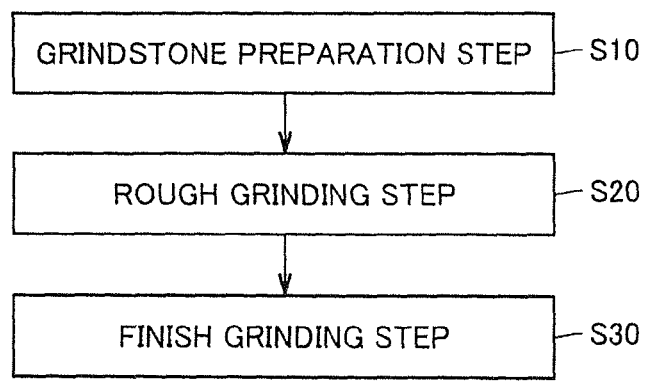
FIG. 7 is a flowchart schematically showing the method for manufacturing the silicon carbide single-crystal substrate in accordance with one embodiment of the present invention.

Next, referring to FIG. 7, a grindstone preparation step is performed as step (S10). In the grindstone preparation step, a grindstone for use in the steps of grinding peripheral edge portion 9 of silicon carbide single-crystal substrate 1 described later is prepared.

Figure 4:
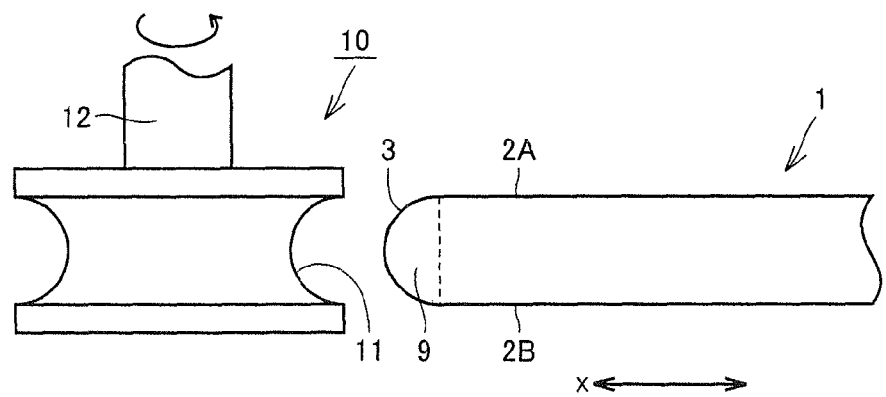
FIG. 4 is a view for illustrating a method for manufacturing the silicon carbide single-crystal substrate in accordance with one embodiment of the present invention.
Figure 6:
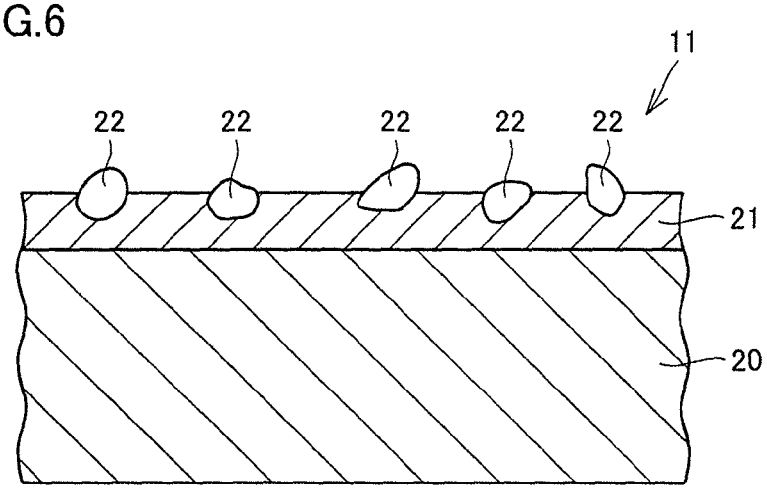
FIG. 6 is an enlarged fragmentary view of a grindstone for use in the method for manufacturing the silicon carbide single-crystal substrate in accordance with one embodiment of the present invention.

Referring to FIG. 4, a grinding portion 10 has a grindstone 11 and a rotary shaft 12 rotating grindstone 11 in an axial direction. Referring to FIG. 6, grindstone 11 has a base metal 20, a binder 21 provided on base metal 20, and diamond abrasive grains 22 embedded in binder 21. In the present embodiment, a metal layer-type grindstone is prepared in which a hardness grade of diamond abrasive grains 22 and binder 21 in accordance with the Japanese Industrial Standards is L to N, and a degree of concentration of diamond abrasive grains 22 is not less than 80 and not more than 150. The metal layer-type grindstone refers to a grindstone having a binder made of a metal.

Preferably, the hardness grade of diamond abrasive grains 22 and binder 21 in accordance with the Japanese Industrial Standards is M, and the degree of concentration of diamond abrasive grains 22 is 125.

Here, the hardness grade is an index indicating the strength with which binder 21 holds the abrasive grains. The hardness grade is classified into 26 types represented by A to Z of the alphabet, in which A represents the lowest hardness grade and Z represents the highest hardness grade. The hardness grade of L to N is classified as a medium hardness grade. It is noted that details of the hardness grade is described in the Japanese Industrial Standards R6240 and R6242.

Here, the degree of concentration is an index indicating how many abrasive grains are contained in an abrasive grain layer. The case where an abrasive grain percentage by volume is 25% (4.4 ct/cm$^3$) is defined as the degree of concentration of 100. For example, in the case where the degree of concentration is 125, the abrasive grain percentage by volume is 1.25 times higher (5.5 ct/cm$^3$) than that in the case where the degree of concentration is 100.

Diamond abrasive grains 22 for use in the present embodiment have a grain size of #400 to #2500. A grain size with a smaller number indicates that the abrasive grains have a larger grain diameter. The abrasive grains with a grain size of #400 have a mean grain diameter of 37 μm, and the abrasive grains with a grain size of #2500 have a mean grain diameter of 6 μm.

It is noted that details of the grain size is described in the Japanese Industrial Standards R6001.

Figure 5:
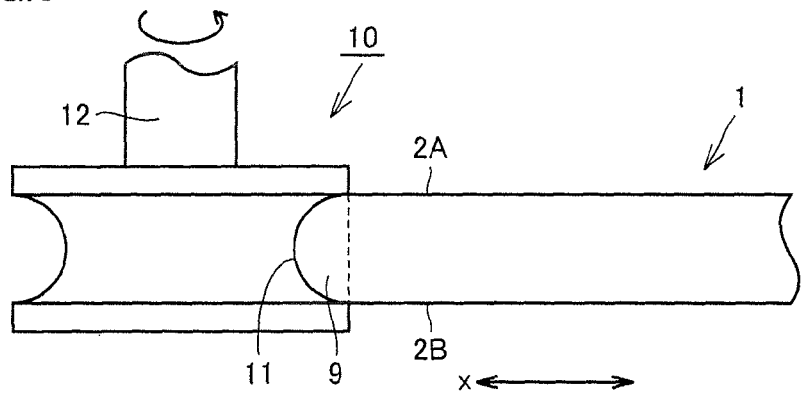
FIG. 5 is a view for illustrating the method for manufacturing the silicon carbide single-crystal substrate in accordance with one embodiment of the present invention.

Next, a rough grinding step is performed as step (S20). In step (S20), peripheral edge portion 9 of silicon carbide single-crystal substrate 1 is ground with a groove having a rough mesh size. Specifically, first, metal layer-type grindstone 11 prepared in step (S10), in which the hardness grade of diamond abrasive grains 22 and binder 21 is L to N, and the degree of concentration of diamond abrasive grains 22 is not less than 80 and not more than 150, is rotated about rotary shaft 12. For grindstone 11, diamond abrasive grains 22 having a grain size of #400 to #600 are used. Similarly, silicon carbide single-crystal substrate 1, which is an object to be ground, is rotated about a central axis of first surface 2A as a rotation axis. Silicon carbide single-crystal substrate 1 has a rotation speed (grinding speed) of not less than 1 mm/second and not more than 4 mm/second. Further, grindstone 11 has a rotation speed in terms of the peripheral speed of not less than 1500 m/minute and not more than 3000 m/minute. As shown in FIG. 5, silicon carbide single-crystal substrate 1 moves in a direction X parallel to first surface 2A and comes into contact with grindstone 11. Peripheral edge portion 9 of silicon carbide single-crystal substrate 1 is ground by friction between grindstone 11 and silicon carbide single-crystal substrate 1. It is noted that a speed at which silicon carbide single-crystal substrate 1 is pressed toward grindstone 11 and ground in a radial direction of the substrate (cutting speed) is not less than 0.05 mm/second and not more than 0.3 mm/second.

In the rough grinding step, peripheral edge portion 9 of silicon carbide single-crystal substrate 1 is ground a plurality of times, and is eventually ground by 100 μm or more. However, the amount of grinding at one time is set to 100 μm or less.

Preferably, in the rough grinding step, diamond abrasive grains 22 having a grain size of #600 are used. Preferably, the cutting speed is 0.1 mm/second. Preferably, the grinding speed is 3 mm/second. Preferably, grindstone 11 has a rotation speed in terms of the peripheral speed of 2500 mm/minute.

Next, a finish grinding step is performed as step (S30). In step (S30), peripheral edge portion 9 of silicon carbide single-crystal substrate 1 is ground with a groove having a fine mesh size. Specifically, first, metal layer-type grindstone 11 prepared in step (S10), in which the hardness grade of diamond abrasive grains 22 and binder 21 is L to N, and the degree of concentration of diamond abrasive grains 22 is not less than 80 and not more than 150, is rotated about rotary shaft 12. For grindstone 11, diamond abrasive grains 22 having a grain size of #800 to #2000 are used. Preferably, diamond abrasive grains 22 having a grain size of #1500 are used for grindstone 11. Similarly, silicon carbide single-crystal substrate 1, which is the object to be ground, is rotated about the central axis of first surface 2A as the rotation axis.

The cutting speed, grinding speed, and grindstone speed in the finish grinding step are the same as those in the rough grinding step.

In the finish grinding step, peripheral edge portion 9 of silicon carbide single-crystal substrate 1 is ground a plurality of times, and is eventually ground by 100 μm or more. However, the amount of grinding at one time is set to 50 μm or less.

Through the above manufacturing method, silicon carbide single-crystal substrate 1 having the chamfer width described above of not less than 50 μm and not more than 400 μm is obtained.

Next, function and effect of silicon carbide single-crystal substrate 1 and the method for manufacturing the same in accordance with the present embodiment will be described.

The silicon carbide single-crystal substrate in accordance with the present embodiment has a chamfer width of not less than 50 μm and not more than 400 μm. Thereby, a silicon carbide single-crystal substrate capable of suppressing occurrence of a crack is obtained.

Further, the surface of the peripheral edge portion of silicon carbide single-crystal substrate 1 in accordance with the present embodiment has an arithmetic mean roughness of not less than 0.07 μm and not more than 3 μm. Thereby, a silicon carbide single-crystal substrate capable of further suppressing occurrence of a crack is obtained.

Furthermore, the process-damaged layer of silicon carbide single-crystal substrate 1 in accordance with the present embodiment has a maximum thickness of not less than 0.5 μm and not more than 10 μm. Thereby, a silicon carbide single-crystal substrate capable of further suppressing occurrence of a crack is obtained.

Example

In the present example, the relationship among occurrence of a crack after formation of an epitaxial layer on a silicon carbide semiconductor substrate, surface roughness $R_a$ of the chamfer portion (peripheral edge portion 9) of silicon carbide single-crystal substrate 1, maximum thickness T of process-damaged layer 9, and chamfer width L was investigated.

First, eight types of silicon carbide single-crystal substrates 1 having surface roughness $R_a$ in a range of not less than 0.05 μm and not more than 5 μm, maximum thickness T of the process-damaged layer in a range of not less than 0.4 μm and not more than 15 μm, and chamfer width L in a range of not less than 30 μm and not more than 500 μm were prepared. Silicon carbide single-crystal substrates 1 in accordance with the present invention's examples 1 to 6 were produced by the manufacturing method described in the embodiment. Next, a silicon carbide epitaxial layer was formed on each silicon carbide single-crystal substrate 1. The epitaxial layer was formed on first surface 2A and peripheral edge portion 9 of silicon carbide single-crystal substrate 1. Formation of the epitaxial layer was performed at a temperature of not less than 1500° C. and not more than 1650° C. and under reduced pressure. $SiH_4/H_2$ was set to about 0.03%. The C/Si ratio was set to not less than 0.7 and not more than 3.0. The film thickness of the epitaxial layer was set to 15 μm.

Thereafter, it was evaluated whether or not the eight types of silicon carbide single-crystal substrates 1 (the present invention's examples 1 to 6, comparative examples 1 and 2) each having the epitaxial layer formed thereon had a crack. Observation of a crack was made with a Nomarski microscope. The magnification of the Nomarski microscope was set to 100, with the magnification of the eyepiece side being set to 10 and the magnification of the objective side being set to 10. It is noted that the microscope may be a stereoscopic microscope. In this case, a crack is observed by a reflection mode.

Observation of a crack was made by observing peripheral edge portion 9 of silicon carbide single-crystal substrate 1 having grinding traces for chamfering. When there was a crack extending from peripheral edge portion 9, the length of the crack in the direction of the main surface (direction of first surface 2A) was observed. In a case where a crack having a predetermined length or more was detected, it was determined that a crack was present, and in a case where a crack having the predetermined length or more was not detected, it was determined that a crack was absent. Table 1 shows experimental results.

TABLE 1

| | Comparative example 1 | Present invention's example 1 | Present invention's example 2 | Present invention's example 3 | Present invention's example 4 | Present invention's example 5 | Present invention's example 6 | Comparative example 2 |
|---|---|---|---|---|---|---|---|---|
| Chamfer portion surface roughness Ra [μm] | 0.05 | 0.07 | 0.1 | 0.5 | 1 | 2 | 3 | 5 |
| Process-damaged layer thickness T [μm] | 0.4 | 0.5 | 1 | 3 | 5 | 7 | 10 | 15 |
| Chamfer width L [μm] | 500 | 400 | 300 | 200 | 150 | 100 | 50 | 30 |
| Ra × T/L | 0.00004 | 0.0000875 | 0.000333 | 0.0075 | 0.033333 | 0.14 | 0.6 | 2.5 |
| Presence/absence of crack after formation of epitaxial layer | Present | Absent | Absent | Absent | Absent | Absent | Absent | Present |

As shown in Table 1, when chamfer width L was not less than 50 μm and not more than 400 μm, a crack was not observed in silicon carbide single-crystal substrates 1 (the present invention's examples 1 to 6) each having the epitaxial layer formed thereon. On the other hand, a crack was observed in silicon carbide single-crystal substrate 1 (comparative example 1) having chamfer width L of 500 μm and silicon carbide single-crystal substrate 1 (comparative example 2) having chamfer width L of 30 μm. In addition, when the chamfer portion had surface roughness $R_a$ of not less than 0.07 μm and not more than 3 μm, a crack was not observed in silicon carbide single-crystal substrates 1 each having the epitaxial layer formed thereon. Further, when the process-damaged layer had maximum thickness T of not less than 0.5 μm and not more than 10 μm, a crack was not observed in silicon carbide single-crystal substrates 1 each having the epitaxial layer formed thereon. Furthermore, when $R_a \times T/L$ had a value of not less than 0.0000875 and not more than 0.6, and when chamfer width L was not less than 50 μm and not more than 400 μm, a crack was not observed in silicon carbide single-crystal substrates 1 each having the epitaxial layer formed thereon.

As described above, it was confirmed that a silicon carbide single-crystal substrate capable of suppressing occurrence of a crack is obtained by adjusting chamfer width L within the above range.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A substrate comprising a silicon carbide single-crystal substrate and an epitaxial layer on said silicon carbide single-crystal substrate,
the silicon carbide single-crystal substrate including:
a first surface;
a second surface opposite to said first surface; and
a peripheral edge portion sandwiched between said first surface and said second surface,
a plurality of grinding traces being formed in a surface of said peripheral edge portion,
a chamfer width as a distance from an outermost peripheral end portion of said peripheral edge portion to one of said plurality of grinding traces which is located on an innermost peripheral side of said peripheral edge portion in a direction parallel to said first surface being not less than 50 μm and not more than 400 μm,
wherein the peripheral edge portion includes a process-damaged layer as a layer having a disrupted crystal lattice,
a thickness of the process-damaged layer measured in a direction that is parallel to the first surface becomes smaller toward the first surface, and
no crack extends from the peripheral edge portion into the epitaxial layer.

2. The substrate according to claim 1,
wherein said surface of said peripheral edge portion has an arithmetic mean roughness of not less than 0.07 μm and not more than 3 μm.

3. The substrate according to claim 1, wherein
said process-damaged layer has a maximum thickness of not less than 0.5 μm and not more than 10 μm.

4. The substrate according to claim 1, wherein the process-damaged layer has the largest thickness measured in the direction that is parallel to the first surface at the center of the substrate, and the thickness continuously decreases towards the first and second surfaces of the substrate.

5. The substrate according to claim 4, wherein a maximal thickness of the process-damaged layer measured in the direction that is parallel to the first surface is not less than 0.5 μm and not more than 10 μm.

6. The substrate according to claim 1, wherein the process-damaged layer has a sickled cross-sectional shape.

7. A substrate including a silicon carbide single-crystal substrate and an epitaxial layer on said silicon carbide single-crystal substrate, the silicon carbide single-crystal substrate comprising:
a first surface;
a second surface opposite to said first surface; and
a peripheral edge portion sandwiched between said first surface and said second surface; and
a plurality of grinding traces in a surface of said peripheral edge portion;
wherein a chamfer width as a distance from an outermost peripheral end portion of said peripheral edge portion to one of said plurality of grinding traces which is located on an innermost peripheral side of said peripheral edge portion in a direction parallel to said first surface being not less than 50 μm and not more than 400 μm, and
no crack extends from said peripheral edge portion into said epitaxial layer.

8. The substrate according to claim 7, wherein said surface of said peripheral edge portion has an arithmetic mean roughness of not less than 0.07 μm and not more than 3 μm.

9. The substrate according to claim 7, wherein
said peripheral edge portion includes a process-damaged layer as a layer having a disrupted crystal lattice, and
said process-damaged layer has a maximum thickness of not less than 0.5 μm and not more than 10 μm.

* * * * *